United States Patent
Nitsche et al.

(10) Patent No.: US 9,045,331 B2
(45) Date of Patent: Jun. 2, 2015

(54) MICROMECHANICAL COMPONENT AND METHOD FOR PRODUCING A MICROMECHANICAL COMPONENT

(71) Applicants: Heiko Nitsche, Reutlingen (DE); Stefan Pinter, Reutlingen (DE); Wolfram Schock, Rommelsbach (DE); Joerg Muchow, Reutlingen (DE); Christoph Friese, Pfullingen (DE)

(72) Inventors: Heiko Nitsche, Reutlingen (DE); Stefan Pinter, Reutlingen (DE); Wolfram Schock, Rommelsbach (DE); Joerg Muchow, Reutlingen (DE); Christoph Friese, Pfullingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 238 days.

(21) Appl. No.: 13/864,623

(22) Filed: Apr. 17, 2013

(65) Prior Publication Data

US 2013/0271807 A1  Oct. 17, 2013

(30) Foreign Application Priority Data

Apr. 17, 2012 (DE) .......................... 10 2012 206 280

(51) Int. Cl.
*B81B 7/02* (2006.01)
*B81C 3/00* (2006.01)
*G02B 26/08* (2006.01)
*B81B 7/00* (2006.01)

(52) U.S. Cl.
CPC . *B81B 7/02* (2013.01); *B81C 3/008* (2013.01); *G02B 26/085* (2013.01); *B81B 2203/0163* (2013.01); *B81B 7/0006* (2013.01)

(58) Field of Classification Search
CPC ...... G02B 26/085; G02B 26/083; B81B 7/02; B81B 7/008; B81C 3/008; B81C 99/002
See application file for complete search history.

(56) References Cited

U.S. PATENT DOCUMENTS

2011/0007376 A1* 1/2011 Pinter et al. ................ 359/221.2

FOREIGN PATENT DOCUMENTS

EP          0836265      4/1998
WO       WO2005078509   8/2005

* cited by examiner

*Primary Examiner* — Joseph P Martinez
(74) *Attorney, Agent, or Firm* — Kenyon & Kenyon LLP

(57) ABSTRACT

A micromechanical component having a control element is described, which is connected via at least one supply line spring having a supply line spring constant to a mounting support in an adjustable manner, and a drive device having at least one actuator component situated on the control element. Via at least one line component guided over the at least one supply line spring an electric potential or a current signal is able to be provided to the actuator component in such a way that the control element is able to be set by the drive device into a motion with respect to the mounting support. The control element is additionally connected to the mounting support, and the supply line spring constant is less than vibratory spring constant. Also described is a method for producing a micromechanical component.

15 Claims, 8 Drawing Sheets

MICROMECHANICAL COMPONENT AND METHOD FOR PRODUCING A MICROMECHANICAL COMPONENT

FIELD OF THE INVENTION

The present invention relates to a micromechanical component. In addition, the present invention relates to a method for producing a micromechanical component.

BACKGROUND INFORMATION

Figure 1A:
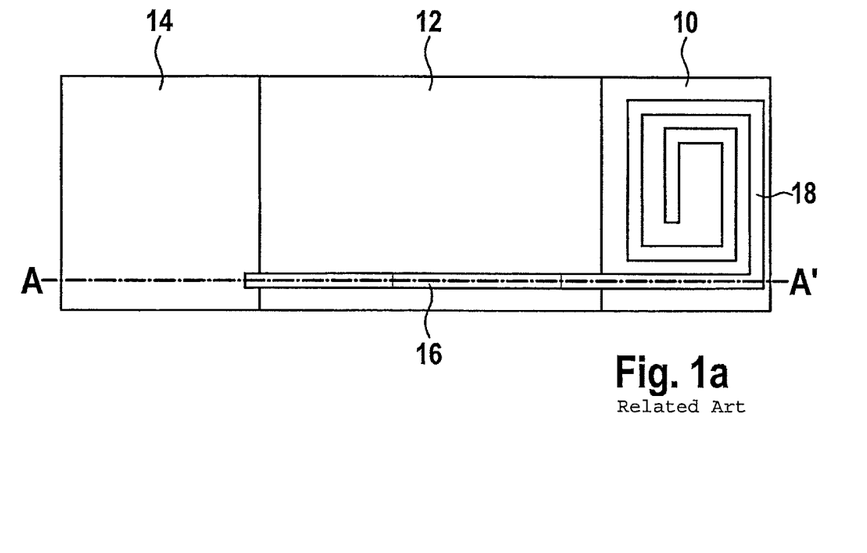
FIGS. 1a and 1b show a top view of, and a cross section through a customary micromechanical component.
Figure 1B:
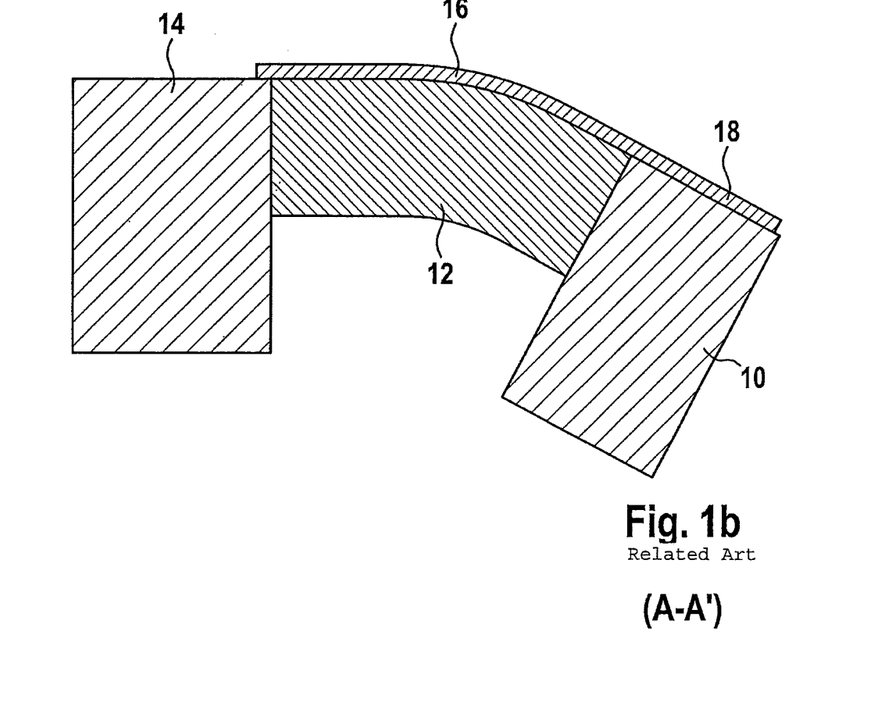

FIGS. 1a and 1b show a top view of, and a cross section through a customary micromechanical component.

The customary micromechanical component that is reproduced schematically in FIGS. 1a and 1b has a control element 10, which is connected via a spring 12 to a mounting support 14. (FIG. 1b shows a cross section along line A-A' through spring 12). A current flow through a coil 18 (schematically reproduced) that is situated on control element 10 is able to be conducted via a line 16 carried on spring 12. By supplying current to coil 18 and providing a magnetic field at coil 18, control element 10 is able to be adjusted based on a Lorenz force in relation to mounting support 14.

With regard to additional development possibilities of the customary micromechanical component according to FIGS. 1a and 1b, reference is made to European Published Patent Application No. 0 836 265 and to International Published Patent Application No. WO 2005/078509.

SUMMARY

The present invention relates to a micromechanical component, and a method for producing a micromechanical component.

Because of the additional connection of the control element via the at least one vibratory spring, that has no line, to the mounting support, the at least one vibratory spring, not having a line, and the at least one supplying spring having the at least one line component guided over it are able to be optimized with regard to their use.

For example, via the additional connection of the control element, via the at least one lineless vibratory spring, to the mounting support, it may be ensured that in response to the adjustment of the control element with regard to the mounting support, an advantageously high spring stiffness is assured. In particular, because of the establishment of the vibratory spring constant as greater than the supply line spring constant for an harmonic vibratory movement of the control element with regard to the mounting support, advantageously large characteristic frequencies may be established. For instance, by a suitable selection of the vibratory constant, characteristic frequencies of more than 20 kHz may be reached. The comparatively large mechanical stress occurring with regard to the mounting support in the at least one vibratory spring, based on its high vibratory spring constant does, however, not have an effect on the at least one line component guided over the at least one supply line spring. Consequently, a mechanical stress of even 100 MPa or more is able to occur in the at least one vibratory spring, without this being connected to an impairment of the at least one line component.

In spite of the desired high stiffness of the connection of the control element to the mounting support, the mechanical stresses in the at least one supply line spring, particularly in the at least one line component, may be kept small by the selection of a low supply line spring constant. Because of the establishment of a supply line spring constant that is less than the vibratory spring constant, the at least one supply line spring is able to be developed in such a way that no high mechanical stresses are able to occur in response to setting the control element into motion with respect to the mounting support in the at least one supply line spring. The stresses may, for example, be less than 100 MPa, in particular less than 50 MPa. Consequently, even in the case of a simple development of the at least one line component, an advantageous mechanical stability of the latter is assured even during frequent use and/or longer operation of the micromechanical component. Particularly a plastic deformation of the at least one line component, which occurs frequently in the case of a customary micromechanical component, may be reliably avoided using the present invention. For that reason, the risk of an undesired damping of the system, based on a plastic deformation of the at least one line component, is also reliably prevented. In spite of a large number of cycles executed, in the case of the micromechanical component, according to the present invention, there is also no breaking of the metal of which the at least one line component is formed.

The at least one line component may be formed, for instance, of a metal like copper, silver and/or gold. That being the case, the at least one line component guided over it may have, in the area of the at least one supply line spring, a comparatively low electrical resistance. In this way it is ensured that the providing of the electrical potential or of the current signal via the at least one line component, which is guided over the at least one supply line spring, is connected with a low power consumption.

Because of the advantageous guidance of the at least one line component via the at least one supply line spring having a supply line spring constant that is less than the vibratory spring constant, the at least one line component thus developed still has a good functional capacity even after a large number of cycles. With that, the present invention makes possible a micromechanical component which, during a frequent and lasting operation, and particularly also in the case of a resonant excitation of the control element, is able to outlast a large number of cycles without the mechanical and/or electrical properties of the micromechanical component changing. At the same time, for the provision of the electrical potential or of the current signal to the actuator component, which is situated on the control element, an advantageously lower overall resistance is ensured.

The supply line spring constant may, for instance, be less than one-half of the vibratory spring constant. The supply line spring constant may particularly be less than one-fifth of the vibratory spring constant. This ensures an advantageously low mechanical stress of the at least one supply line spring, during the motion of the control element with respect to the mounting support.

In one advantageous specific embodiment, the at least one supply line spring is formed exclusively of at least one conductive material, which spans at least one gap lying between the control element and the mounting support in a self-supporting manner Such a supply line spring having the advantageously low supply line spring constant is produced in a simple manner in that after applying the at least one conductive material of the at least one supply line spring, the carrier layer material lying below it, such as the substrate material lying below it, is removed.

In one further advantageous specific embodiment, the at least one supply line spring is patterned out of a first layer having a first layer thickness, the at least one vibratory spring being patterned out of a second layer having a second layer thickness that is greater than the first layer thickness. This procedure for producing the at least one supply line spring and the at least one vibratory spring ensures the advantageous ratio between the supply line spring constant and the vibratory spring constant.

As an alternative or as a supplementation to this, the at least one supply line spring may be developed to be meander-shaped and/or spiral-shaped. This, too, has the effect of weakening the mechanical stiffness of the at least one supply line spring by extending its spring length so as to reduce the mechanical stresses occurring in it in response to the motion of the control element with respect to the mounting support.

The drive device may advantageously include a magnetic drive having a coil component situated on the control element as an actuator component. Because of the advantageous additional connection of the control element to the mounting support, using the at least one vibratory spring, the coil component is able to be supplied with an operating current in a simple manner using the at least one line component, which is guided via the at least one supply line spring, an advantageously low current consumption being ensured at the same time.

In one advantageous refinement, the control element includes a mirror component or a filter component, the coil component being at least partially situated on or in a coil plate, on which a spacer is anchored whose end, facing away from the coil plate, contacts an inner side of the mirror component or the filter component that faces away from an incident light surface of the mirror component or the filter component, the at least one vibratory spring being anchored with its first spring end on the mounting support and with its second spring end on the mirror component or the filter component. This implements an electromagnetic drive, situated below the mirror plate or filter plate, having a magnetic lever for optimizing the disposable force and/or deflection.

The advantages mentioned above may also be assured using a micromirror having such a micromechanical component.

The advantages described are also able to be implemented by carrying out a corresponding production method for a micromechanical component.

DETAILED DESCRIPTION

Figure 2A:
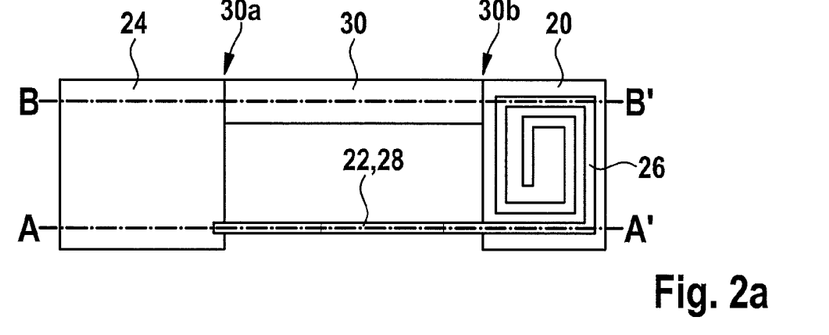
FIGS. 2a-2c show a top view and two cross sections of a first specific embodiment of the micromechanical component.
Figure 2B:
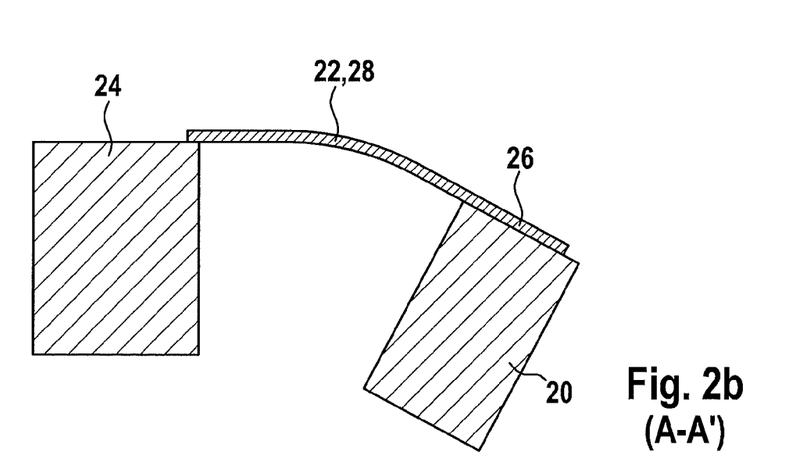
Figure 2C:
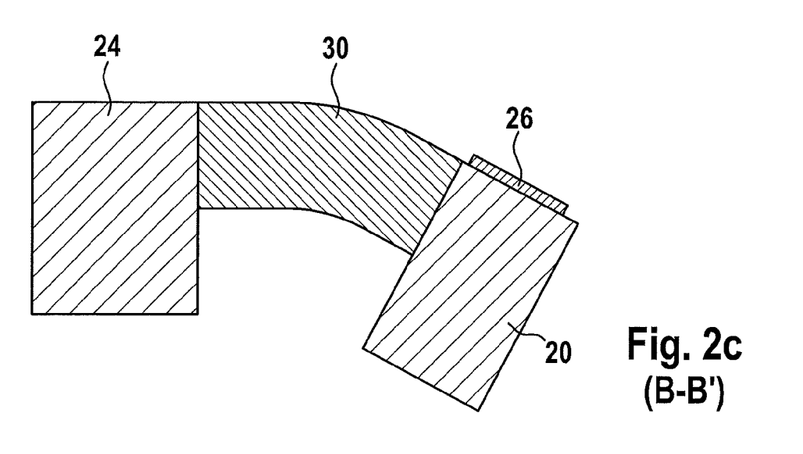

FIGS. 2a to 2c show a top view and a cross section of a first specific embodiment of the micromechanical component.

The micromechanical component that is reproduced schematically in FIGS. 2a to 2c has a control element 20, which is connected via at least one supply line spring 22, having a supply line spring constant, adjustably to a mounting support 24. (FIG. 2b shows a cross section along line A-A' through supply line spring 22). In addition, the micromechanical component includes a drive device (that is only partially reproduced) having at least one actuator component 26 situated on control element 20, via at least one line component 28 guided via the at least one supply line spring 22, an electrical potential or a current signal being able to be provided to the actuator component 26 in such a way that control element 20, using the drive device, is able to be set into a motion with respect to mounting support 24. The drive device may, for instance, include a magnetic drive having a coil component situated on the control element 20 as an actuator component 28. In this case, by supplying current to the coil component as actuator component 26 and by providing a magnetic field, at the coil component a Lorenz force is able to be exerted on control element 20, in such a way that control element 20 is set by the Lorenz force into the desired motion with respect to mounting support 24. The geometry of the coil component (only reproduced schematically) and the alignment of the magnetic field interacting with it are able to be selected/fixed using great freedom of design. In addition, the micromechanical component is not limited to being outfitted with a drive device including a magnetic drive. The drive device, instead of, or in supplementation to the magnetic drive, may, for example, also have an electric drive having an actuator electrode situated on control element 20 as actuator component 26 and a stator electrode fixed on mounting support 24.

In the micromechanical component, the control element is additionally connected via at least one lineless vibratory spring 30 to mounting support 24. (The cross section of FIG. 2c runs along line B-B' through vibratory spring 30.) By this one may understand that the at least one lineless vibratory spring 30 is anchored in each case at a first end 30a on mounting support 24 and at a second end 30b on control element 20. In addition, lineless vibratory spring 30 has no line components that are guided over vibratory spring 30. By this, one may also understand that the at least one vibratory spring 30 is not developed as a line component. In a preferred manner, the at least one lineless vibratory spring 30 is developed from a material having a comparatively low conductivity. The at least one vibratory spring 30 preferably has no metal in it. The at least one vibratory spring 30 may be made, for instance, (completely) of silicon, especially non-doped silicon and/or an insulating material.

The supply line spring constant of the at least one supply line spring 22 is less than the vibratory spring constant of the at least one vibratory spring 30. The supply line spring constant is, for instance, less than one-half of the vibratory spring constant. The supply line spring constant may particularly be less than one-fifth of the vibratory spring constant. One may also paraphrase the advantageous ratio between the supply line spring constant and the vibratory spring constant in such a way that the mechanical properties of the vibratory system formed of springs 22 and 30 and control element 20 are defined, using the at least one vibratory spring 30 that is able to be designated as the working spring.

By supply line spring constant of the at least one supply line spring 22 and/or the vibratory spring constant of the at least one vibratory spring 30, one should preferably understand the spring constant which acts counter to a (preferred) vibratory motion/deviation motion of control element 20. The supply line spring constant of the at least one supply line spring 22 and/or the vibratory spring constant of the at least one vibratory spring 30 may also be circumscribed to say that control element 20 is able to be set into vibratory motion/excursion motion using the drive device against a counterforce/spring force effected by the supply line spring constant and the vibratory spring constant. In particular, at least one subunit of control element 20 is able to be set into a natural vibration/resonance vibration using the drive device, the natural frequency/resonant frequency being yielded by the supply line spring constant of the at least one supply line spring 22 deformed/bent in the process and/or of the vibratory spring constant of the at least one vibratory spring 30 deformed/bent during this time.

The supply line spring constant may be selected to be so low that the mechanical stress occurring in the at least one supply line spring 22 during the motion of control element 20 with respect to mounting support 24 is minimal. In particular, the stiffness of the at least one supply line spring 22 may be so low that the frequency of the at least one natural mode of the vibratory system used for adjusting control element 20 with respect to mounting support 24 is not/hardly influenced by the supply line spring constant. Consequently, in the at least one supply line spring 22, only very slight mechanical stresses occur during the motion of control element 20 with respect to mounting support 24. The mechanical stresses occurring in the at least one supply line spring 22 are therefore able to have no effect on the at least one line component 28 guided over it. This being the case, one need not be concerned about any plastic deformation of the at least one line component 28 during the motion of control element 20 with respect to mounting support 24. That is why the at least one line component 28 still has its desired shape/functionability, even in case of frequent and long-lasting operation of the micromechanical component described here.

At the same time, it may be assured, using the at least one vibratory spring, that an overall stiffness of the spring system, via which control element 20 is connected to mounting support 24, has a comparatively high value. Consequently, using the at least one vibratory spring 30, a preferred natural frequency/resonant frequency of the vibratory motion/excursion motion of control element 20 with respect to mounting support 24 may be fixed.

Since the at least one vibratory spring 30 is not used to guide the at least one line component 28 between actuator component 26 and a unit cooperating with it on the mounting support 24, the advantageously high vibratory spring constant may be selected. Consequently, using a suitable establishment of the vibratory spring constant, an advantageously high natural frequency/resonant frequency of the vibratory motion/excursion motion of control element 20 with respect to mounting support 24 may be fixed, particularly a natural frequency greater than 20 kHz. Although the mechanical stresses in the at least one vibratory spring 30 are able to become relatively big, based on its high vibratory spring constant during the vibratory motion/excursion motion of control element 20 with respect to mounting support 24, this has no effect on the at least one line component 28, which is only guided via the at least one supply line spring 22.

Therefore, to form the at least one line component 28 (exclusively) at least one metal, such as copper, silver and/or gold may be used. One may do without using silicon to form the at least one line component 28, which customarily, based on its mechanical rigidity, is frequently used in semiconductor technology to form lines. This ensures an increased electrical conductivity of the at least one line component 28, compared to a customary line made of silicon.

The micromechanical component shown in FIGS. 2a to 2c and the specific embodiments described further on are able to be produced, for example, by connecting control element 20 to mounting support 24 via at least one supply line spring 22 (having the supply line spring constant). In addition, control element 20 is connected to mounting support 24 via the at least one lineless vibratory spring 30 (having the vibratory spring constant), where the supply line spring constant is/or is established to be less than the vibratory spring constant. In addition, a drive device is developed, at least one actuator component 26 of the drive device being situated on control element 20 and at least one line component 28, via which, during operation of the drive device, an electrical potential or a current signal is provided for actuator component 26, and is guided via the at least one supply line spring 22 in such a way that control element 20 is set into motion with respect to mounting support 24, using the operated drive device. The drive device is able to be developed, for example, as actuator component 26, using a magnetic drive having a coil component situated on control element 20. As an alternative, or in supplementation to this, the drive device may also be developed having an electric drive having at least one actuator electrode on control element 20 and at least one stator electrode on mounting support 24.

In the specific embodiment shown in FIGS. 2a to 2c, the at least one supply line spring 22 is formed exclusively of at least one conductive material, preferably at least one metal, which spans at least one gap lying between the control element 22 and the mounting support 24 in a self-supporting manner The at least one material of the respective supply line spring 22 almost hangs in the air. By guidance of the at least one line component 22 via the at least one supply line spring 22, one may consequently also understand the development of the at least one supply line spring 22 as at least one line component 28. This development of the at least one supply line spring 22/the at least one line component 28 ensures the advantageously low supply line spring constant, in a simple manner.

For the development of the at least one supply line spring 22 as at least one line component 28, at least one conductive material may be deposited on a carrier layer, such as the initial substrate of the micromechanical component. Subsequently, the carrier layer material, covered by the at least one conductive material (of the at least one supply line spring 22), of the carrier layer is removed. This may take place especially by backside etching. Thus, the advantageously low establishment of the supply line spring constant is able to be implemented by a small number of method steps.

Figure 3A:
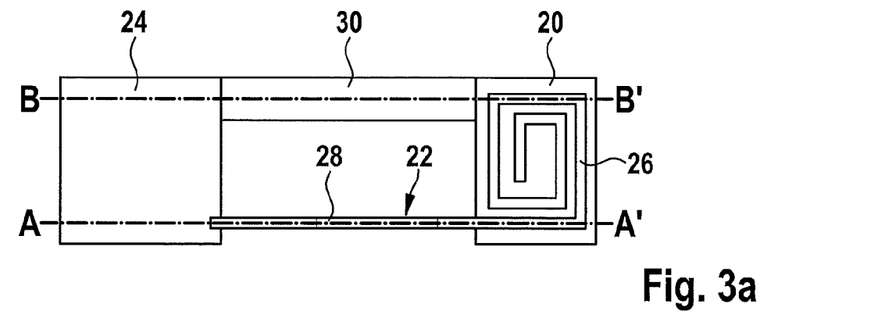
FIGS. 3a-3c show a top view and two cross sections of a second specific embodiment of the micromechanical component.
Figure 3B:
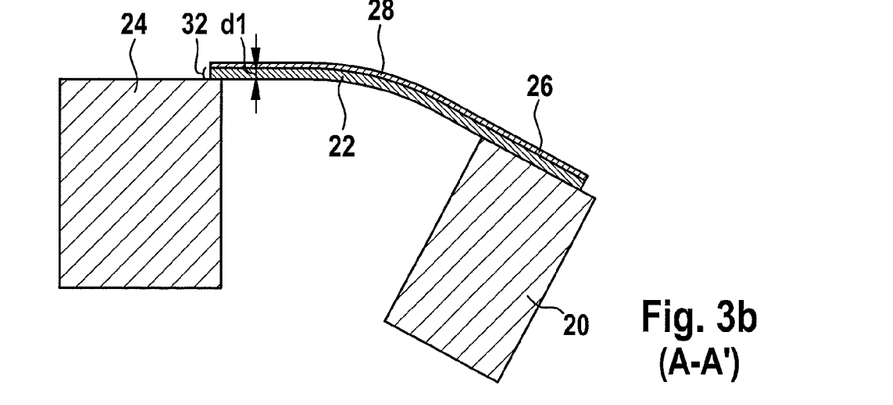
Figure 3C:
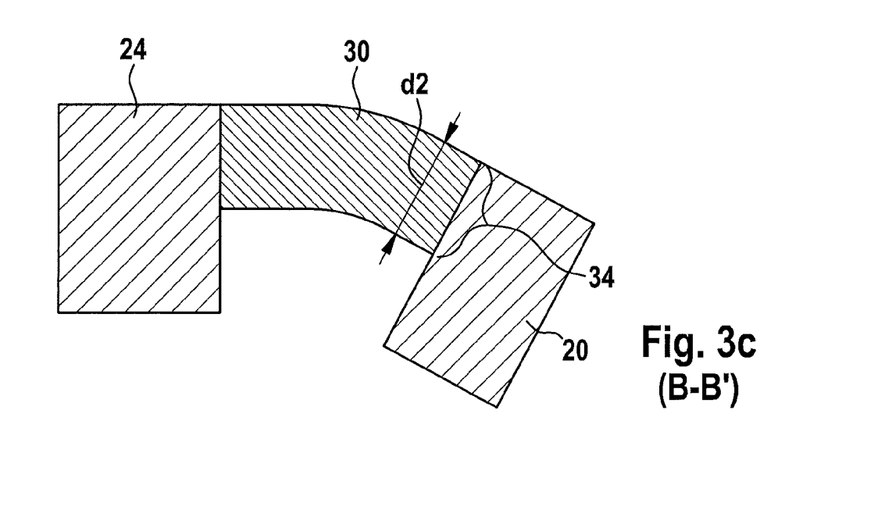

FIGS. 3a to 3c show a top view and two cross sections of a second specific embodiment of the micromechanical component.

In the specific embodiment reproduced schematically in FIGS. 3a to 3c, the at least one supply line spring 22 (through which the cross section along line A-A' of FIG. 3b runs) is patterned out of a first layer 32 having a first layer thickness d1. The at least one vibratory spring 30 (through which the cross section along line B-B' of FIG. 3c runs) is patterned out of a second layer 34, a second layer thickness d2 of second layer 34 being greater than a first layer thickness d1 of first layer 32. The second layer thickness d2 may be greater than the first layer thickness d1 by a factor of at least 2, preferably 4, especially preferably 8. This ensures the advantageously high vibratory spring constant as opposed to the comparably low supply line spring constant.

The mechanical stress on the surface of a spring 22 or 30 at its bending scales with layer thickness d1 or d2 of layer 32 or 34 used for patterning out the respective spring 22 or 30. Consequently, because of the comparatively small first layer thickness d1 of first layer 32, of which at least one supply line spring 22 is patterned out, and the relatively large second layer thickness d2 of second 34, which is the initial material of the at least one vibratory spring 30, one obtains the advantageous ratio between the supply line spring constant and the vibratory spring constant. In spite of the development of the at least one vibratory spring 30 and the at least one supply line spring 22 from the same material and/or the same lengths and/or the same widths of springs 22 and 30, the advantages described above are able to be put into effect.

Figure 4A:
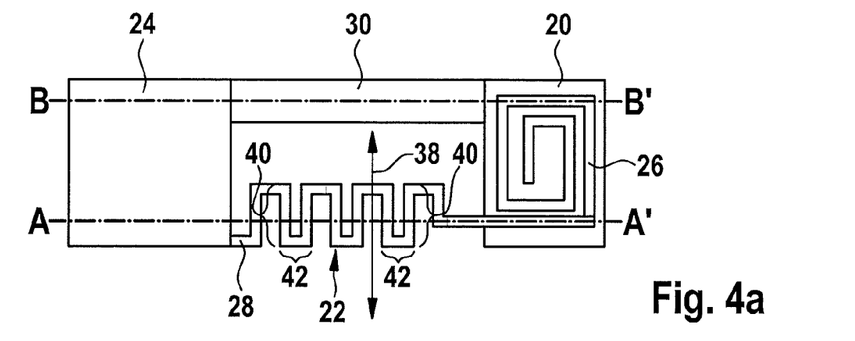
FIGS. 4a-4c show a top view and two cross sections of a third specific embodiment of the micromechanical component.
Figure 4B:
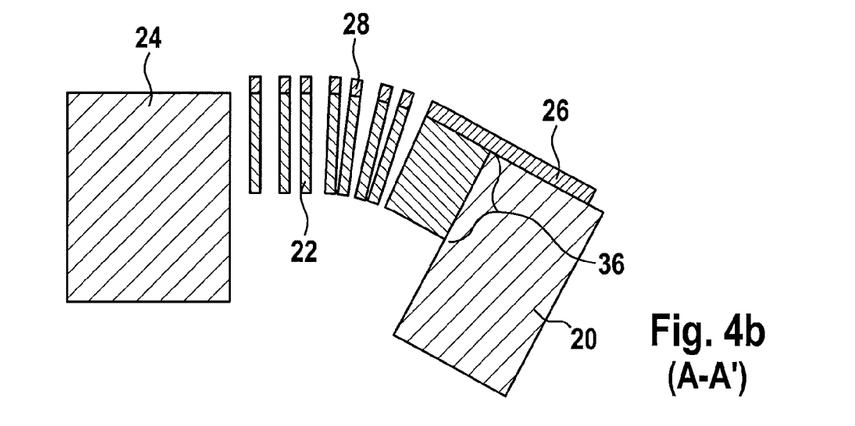
Figure 4C:
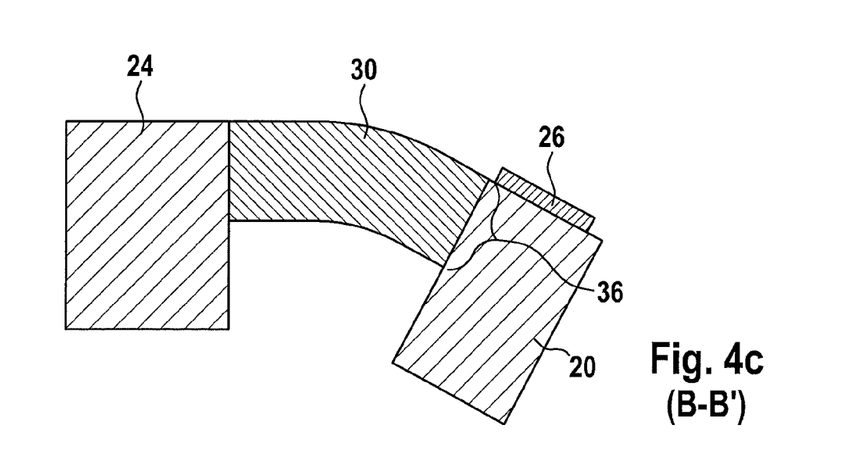

FIGS. 4a to 4c show a top view and two cross sections of a third specific embodiment of the micromechanical component.

In the micromechanical component shown in FIGS. 4a to 4c, the at least one supply line spring 22 is developed in meander shape. As an alternative or in supplementation to a supply line spring 22 that is developed in a meander shape, a micromechanical component may also have a supply line spring 22 that is developed as a spiral shape.

Because of the extension of the length of the spring of the meander-shaped or spiral-shaped supply line spring 22, the effect is a weakening of the mechanical stiffness of the supply line spring 22, which contributes to a reduction in the mechanical stresses occurring in it upon the motion of control element 20 with respect to mounting support 24. The advantageous ratio of supply line spring constant to vibratory spring constant is thus also able to be ensured if the at least one supply line spring 22 and the at least one vibratory spring 30 are patterned out of a common initial layer 36. One may therefore do without the deposition and patterning of two layers having different layer thicknesses to form springs 22 and 30. In addition, the advantageous spiral-shaped or meander-shaped form of the at least one supply line spring 22 is able to be established using a front side trench and a backside trench in a simple manner In the case of the specific embodiment shown in FIGS. 4a to 4c, initial layer 36 is a subunit of the initial substrate of which the micromechanical component is formed. A further example of a usable initial layer 36 is mentioned below.

For the meandering of the at least one supply line spring 22, a form may be selected in which a plurality of (comparatively long) spring sections-running-alongside-the gap 40, that are aligned in parallel to the gap longitudinal direction 38 of a spanned gap, are connected to one another in each case by using short transverse-to-the-gap spring sections 42. By gap longitudinal direction 38 one may particularly understand an axis running concentrically between the anchorings of supply line spring 22 on control element 20 and on mounting support 24 respectively. (The cross section along line A-A' of FIG. 4b thus runs perpendicular to gap longitudinal direction 38, while the cross section along line B-B' of FIG. 4c runs concentrically through vibratory spring 30.) With that, the distances between two (specifiable) contact surfaces of two transverse-to-the-gap spring sections 42, which contact spring-sections-running-alongside-the-gap 40, are greater in the specific embodiment shown in FIGS. 4a to 4c than the distances between two (specifiable) contact surfaces of two spring-sections-running-alongside-the-gap 40 on a transverse-to-the-gap spring sections 42 that is contacted in common. An additional advantageous form of a supply line spring developed to be meander-shaped will be described further below.

Figure 5A:
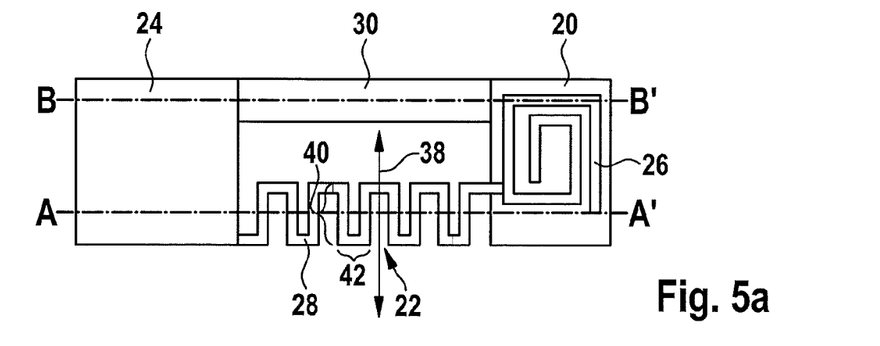
FIGS. 5a-5c show a top view and two cross sections of a fourth specific embodiment of the micromechanical component.
Figure 5B:
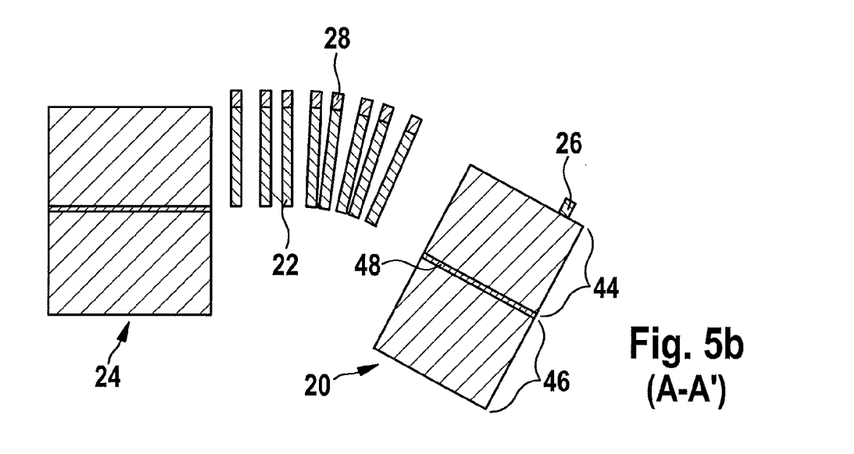
Figure 5C:
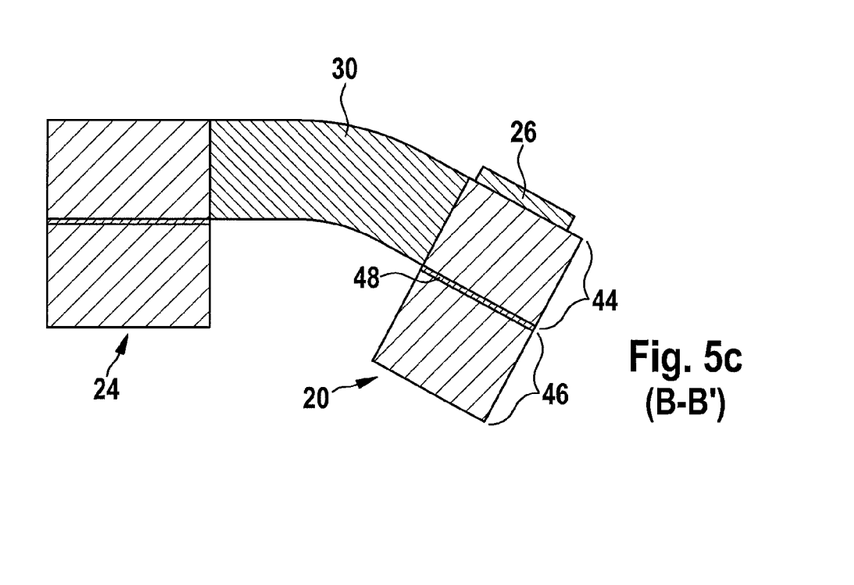

FIGS. 5a to 5c show a top view and two cross sections of a fourth specific embodiment of the micromechanical component.

In the micromechanical component reproduced in FIGS. 5a to 5c, the at least one supply line spring 22 and the at least one vibratory spring 30 are also patterned out of a common initial layer 44. In the specific embodiment of FIGS. 5a to 5c, however, initial layer 44 is a semiconductor layer applied onto a substrate 46, an insulating layer 48 being developed between initial layer 44 and substrate 46. One may also rewrite this to say that initial layer 44 is an applied semiconductor layer of an SOI wafer. Apart from that, we refer to the above statements concerning the specific embodiment of FIGS. 5a to 5c.

Figure 6A:
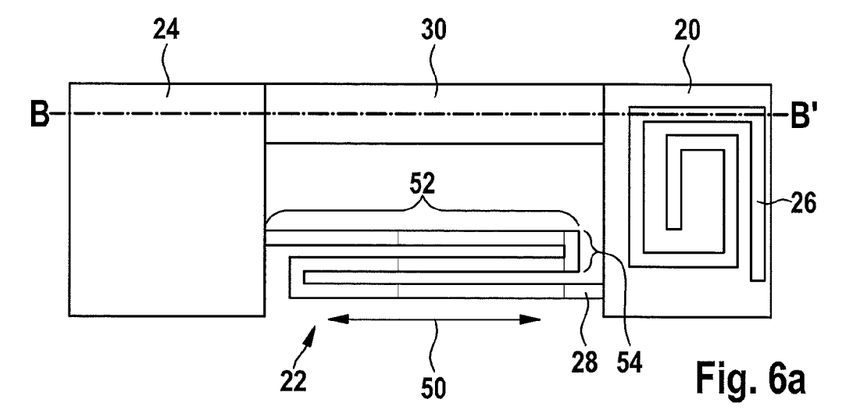
FIGS. 6a and 6b show a top view and a cross section of a fifth specific embodiment of the micromechanical component.
Figure 6B:
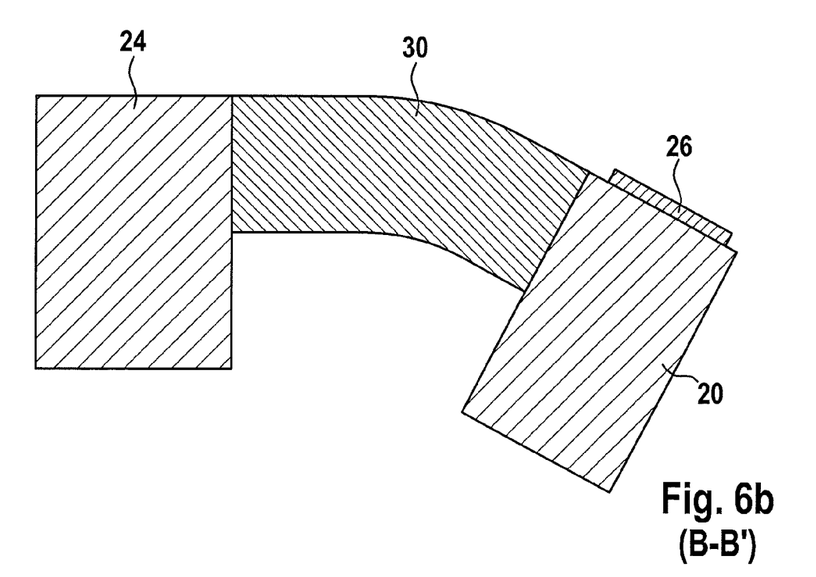

FIGS. 6a and 6b show a top view and a cross section of a fifth specific embodiment of the micromechanical component. (The cross section of FIG. 6b runs along line B-B' concentrically through vibratory spring 30.)

Tension spring 22 of the micromechanical component reproduced schematically in FIGS. 6a and 6b has a meandering in which a plurality of (comparatively long) transverse-to-the-gap spring sections 52 aligned in parallel to the transverse-to-the-gap direction 50 are connected to one another in each case using short spring-sections-running-alongside-the-gap 54. With that, the distances between two (specifiable) contact surfaces of two transverse-to-the-gap spring sections 52, which contact a spring-section-running-alongside-the-gap 54, are greater in the specific embodiment shown in FIGS. 6a than the distances between two (specifiable) contact surfaces of two spring-sections-running-alongside-the-gap 54 on a transverse-to-the-gap spring section 52 that is contacted in common. (The transverse-to-the-gap direction 50 runs perpendicular to the gap longitudinal direction not sketched.) Apart from that, we refer to the above statements concerning the specific embodiment of FIGS. 6a and 6b.

The advantages explained of the specific embodiments described above are also assured in the case of a micromirror having such a micromechanical component. The applicability of the abovementioned specific embodiments of the micromechanical component is, however, not limited to a micromirror.

Figure 7A:
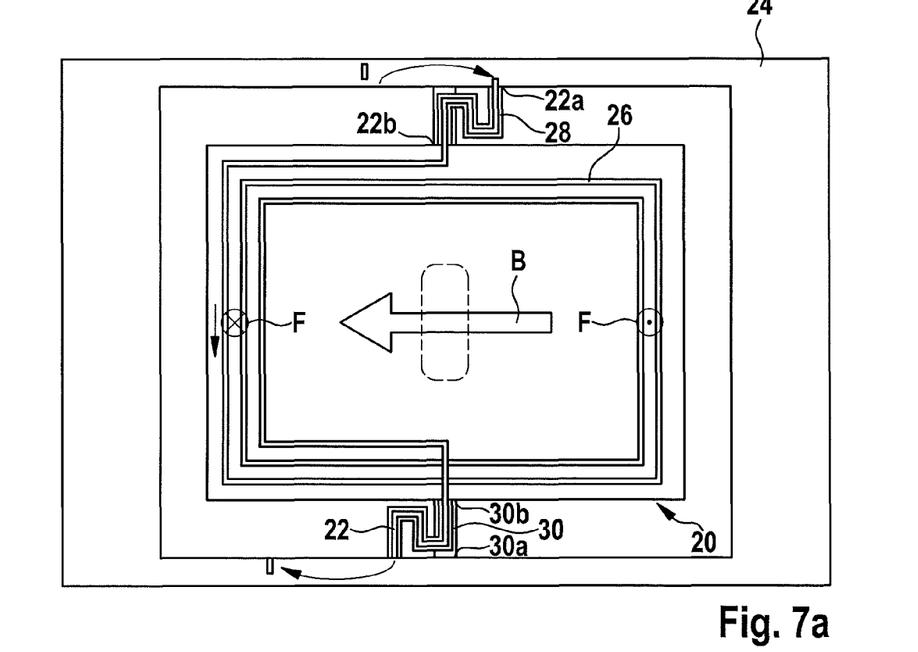
FIGS. 7a and 7b show a top view and a cross section of a sixth specific embodiment of the micromechanical component.
Figure 7B:
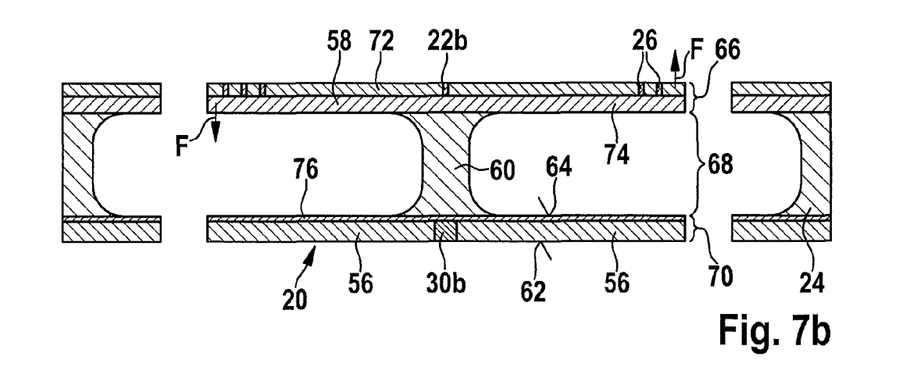

FIGS. 7a and 7b show a top view and a cross section of a sixth specific embodiment of the micromechanical component.

The micromechanical component shown schematically in FIGS. 7a and 7b has the components already described above. As a refinement, control element 20 includes a mirror component or a filter component 56. In addition, a coil component is situated as actuator component 26 at least partially on or in a coil plate 58. On coil plate 58, a spacer 60 is anchored, whose end facing away from coil plate 58 contacts an inner side 64 facing away from an incident light surface 62 of the mirror component or filter component 56.

As may be recognized with the aid of FIG. 7b, control element 20 of the specific embodiment described here has a design made up of three planes 66 to 70. A plane that may be designated as a drive plane 66, which is at the greatest distance from incident light surface 62, has the coil component as actuator component 26, the individual line strands being embedded in an insulating material 72. Besides that, the drive plane may have a semiconductor carrier structure 74, on whose maximal plane, facing away from incident light surface 72, actuator component 26 and insulating material 72 have been applied. (Semiconductor carrier structure 74 may, however, also be at least partially removed, after the application of actuator component 28 and insulating material 72.

An intermediate plane 68 of control element 20 is formed by spacer 60. Spacer 60 may have any optional size. Spacer 60 may be formed, for example, by isotropic underetching of the mirror component or the filter component.

An optical plane 70, whose boundary surfaces are the incident light surface 62 and the inner side 64, has the mirror component or filter component 64. Inner side 64 may optionally be covered by an insulating layer 76. Drive plane 68 and optical plane 70 are thus designed to be separate in this specific embodiment. The drive of the drive device thus exerts no direct force on mirror component or filter component 58. For this reason, the drive also does not cause any deformation of mirror component or filter component 56. In addition, separate springs 22 and 30 may simply be developed in both planes 66 and 70.

The construction of control element 20 from the three planes 68 to 70 ensures a comparatively small expansion of the control element along incident light surface 62, since the comparatively extensive coil component is able to be applied at least partially outside/below incident light surface 62. The area reduction of control element 20, that is able to be effected in this way along incident light surface 62, is connected with cost reduction and simplifies its arrangement in a preferred application position. At the same time, the construction of control element 20 from the three planes 66 to 70 ensures a compound lever arrangement for increasing the drive efficiency.

Furthermore, one is able to implement the advantage of two different spring systems, the at least one vibratory spring 30 being able to be used for a desired rotation of mirror component or filter component 56 and the at least one supply line spring 22 for the electric supply line. The at least one supply line spring 22, in this case too, may be designed to be so flexible that it exerts no, or hardly any readjusting effect on mirror component or filter component 56, and that hardly any, or no mechanical stresses build up during an adjusting motion of mirror component or filter component 56 in the at least one supply line spring 22. The material of the at least one supply line spring 22 and/or of the at least one line component 28 is thus hardly, or very little stressed by the adjusting motion of mirror component or filter component 56.

The at least one supply line spring 22 is preferably anchored on mounting support 24 using a first spring end 22a and using a second spring end 22b on coil plate 58. All the exemplary embodiments described above may be used for the development of the at least one supply line spring 22. The at least one supply line spring 22 is meander-shaped or spiral-shaped, for example. The at least one supply line spring 22 may also be developed as a free-standing line component 28 made of metal. For the further stabilization of the at least one supply line spring 22 of the at least one line component 28, the latter may also be embedded in an oxide and/or be provided with a support made of silicon.

The at least one vibratory spring 30 is preferably anchored on mounting support 24 using a first spring end 30a and using a second spring end 30b on mirror component or filter component 56. This might also be paraphrased to say that mirror component or filter component 58 is (mainly) carried by the at least one vibratory spring 30 (in a recess, or a free space of mounting support 24). The at least one vibratory spring 30 preferably specifies an axis of rotation of mirror component or filter component 56. On the basis of the implementable, comparatively large vibratory spring constant, a preferred resonant frequency and/or a desired excursion direction of a rotational motion of mirror component or filter component 56 are reliably able to be established.

An adjusting motion of incident light surface 62 of the micromechanical component is able to be triggered by supplying current to the coil component and a magnetic field B is applied/provided on the coil component. The field lines of magnetic field B preferably run perpendicular to a rotational axis established by the at least one vibratory spring 30 and/or parallel to incident light surface 62. To the extent that the loops of the coil component run radially about a center point of the inner side 64, all the sections of the coil component have the effect of a force F, which (as a function of the direction of the current) is aligned perpendicular to incident light surface 62. (The coil portions that are aligned perpendicular to the axis of rotation only generate force components that are mutually compensating. Consequently, a unidirectional magnetic field B may be used to adjust the control element. However, the ability to develop the coil components and the alignment of magnetic field B are not limited to the exemplary embodiment reproduced in this instance.

The micromechanical component described here is able to be equipped with a comparatively large coil component/coil, without this having the effect of an additional enlargement of the extension of control element 20 aligned parallel to incident light surface 62. Consequently, the micromechanical component may be used particularly for implementing a micromirror device equipped with two mirrors, such as a projector or a scanner. A light beam may, for example, be deflected via a first mirror about a first axis, before it impinges upon incident light surface 62 of the micromechanical component shown in FIGS. 7a and 7b. Since the light beam does not impinge upon incident light surface 62 in a stationary manner, a comparatively large incident light surface 62 of the micromechanical component is advantageous for deflecting the light beam about a second axis. However, using the technology according to the present invention described here, one is able to implement a micromechanical component, whose control element 20, in spite of its comparatively large incident light surface 62, has a comparatively small extension parallel to incident light surface 62, based on the development of the coil component in drive plane 66, outside optical plane 70.

The advantageous specific embodiment is producible by positioning the coil component at least partially on or in a coil plate, and the coil plate, having a spacer anchored to it, is connected to a mirror component or filter component of the control element, one end of the spacer facing away from the coil plate being connected to an inner side of the mirror component or filter component facing away from an incident light surface of the mirror component or filter component; and the at least one vibratory spring being anchored by its first spring end to the mounting support and by its second spring end to the mirror component or filter component.

Figure 8:
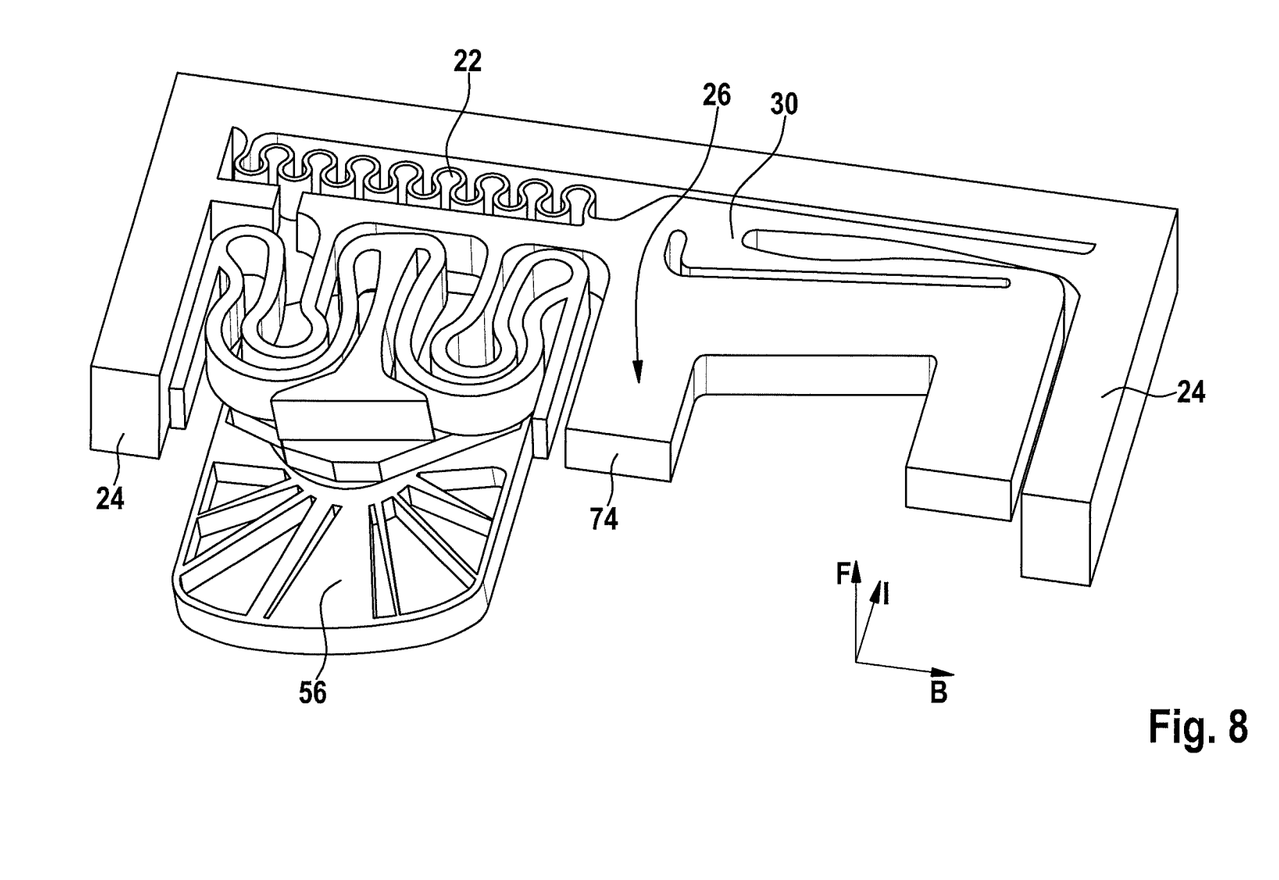
FIG. 8 show a partial illustration of a seventh specific embodiment of the micromechanical component.

A partial illustration of a seventh specific embodiment of the micromechanical component is shown in FIG. 8.

The micromechanical component shown schematically in FIG. 8 has the components already described above. As may be recognized in FIG. 8, an advantageous contacting of actuator component 26 developed as coil component is able to be implemented via a meander-shaped metallization as line component.

In a preferred manner, the anchoring point of the at least one supply line spring 22 on mounting support 24 developed, for example, as a drive frame is selected in such a way that bending, that is as little as possible, of the at least one supply line spring 22 during the adjusting motion of control element 20 with respect to mounting support 24 takes place. In the case of a pure rotational motion of control element 20, for example, that is adjusted by current I guided through the coil component, an anchoring point of the at least one supply line spring 22 is able to lie at a piercing point of the axis of rotation of control element 20. Consequently, only a purely rotational stress of the at least one supply line spring 22 takes place. This avoids stressing line component 28, that is guided via the at least one supply line spring 22.

What is claimed is:

1. A micromechanical component, comprising:
   at least one supply line spring having a supply line spring constant;
   a mounting support;
   a control element connected via the at least one supply line spring to the mounting support in an adjustable manner;
   at least one line component guided via the at least one supply line spring;
   at least one lineless vibratory spring having a vibratory spring constant; and
   a drive device including at least one actuator component situated on the control element via the at least one line component, wherein:
      one of an electric potential and a current signal is able to be provided to the at least one actuator component in such a way that the control element is able to be set into a motion with respect to the mounting support, using the drive device,
      the control element is additionally connected via the at least one lineless vibratory spring to the mounting support, and
      the supply line spring constant is less than the vibratory spring constant.

2. The micromechanical component as recited in claim 1, wherein the supply line spring constant is less than one-half of the vibratory spring constant.

3. The micromechanical component as recited in claim 2, wherein the supply line spring constant is less than one-fifth of the vibratory spring constant.

4. The micromechanical component as recited in claim 1, wherein the at least one supply line spring is foamed exclusively of at least one conductive material that spans at least one gap lying between the control element and the mounting support in a self-supporting manner.

5. The micromechanical component as recited in claim 1, wherein:
   the at least one supply line spring is patterned out of a first layer having a first layer thickness, and
   the at least one vibratory spring is patterned out of a second layer having a second layer thickness that is greater than the first layer thickness.

6. The micromechanical component as recited in claim 1, wherein the at least one supply line spring is at least one of meander-shaped and spiral-shaped.

7. The micromechanical component as recited in claim 1, wherein the drive device includes a magnetic drive having a coil component situated on the control element as the at least one actuator component.

8. The micromechanical component as recited in claim 7, wherein:
   the control element includes one of a mirror component and a filter component,
   the coil component is at least partially situated one of on and in a coil plate, on which a spacer is anchored, an end of the spacer, facing away from the coil plate, contacting an inner side of one of the mirror component and the filter component that faces away from an incident light surface of the one of the mirror component and the filter component, and
   the at least one vibratory spring is anchored with a first spring end thereof on the mounting support, and with a second spring end thereof on the one of the mirror component and the filter component.

9. A micromirror, comprising:
   a micromechanical component, comprising:
      at least one supply line spring having a supply line spring constant;
      a mounting support;
      a control element connected via the at least one supply line spring to the mounting support in an adjustable manner;
      at least one line component guided via the at least one supply line spring;
      at least one lineless vibratory spring having a vibratory spring constant; and
      a drive device including at least one actuator component situated on the control element via the at least one line component, wherein:
         one of an electric potential and a current signal is able to be provided to the at least one actuator component in such a way that the control element is able to be set into a motion with respect to the mounting support, using the drive device,
         the control element is additionally connected via the at least one lineless vibratory spring to the mounting support, and
         the supply line spring constant is less than the vibratory spring constant.

10. A method for producing a micromechanical component, comprising:
    connecting a control element via at least one supply line spring having a supply line spring constant to a mounting support; and
    developing a drive device;
    situating at least one actuator component of the drive device on the control element;
    providing at least one line component via which, during operation of the drive device, one of an electric potential and a current signal is provided to the at least one actuator component;
    guiding the at least one line component via the at least one supply line spring in such a way that the control element is set into motion with respect to the mounting support using the operated drive device;
    additionally connecting the control element to the mounting support via at least one lineless vibratory spring having a vibratory spring constant, the supply line spring constant being less than the vibratory spring constant.

11. The production method as recited in claim 10, further comprising:
    in order to form the at least one supply line spring, depositing at least one conductive material on a carrier layer; and
    subsequently, removing a carrier layer material of the carrier layer covered by the at least one conductive material.

12. The production method as recited in claim 10, further comprising:
    patterning the at least one supply line spring out of a first layer having a first layer thickness; and
    patterning the at least one vibratory spring out of a second layer having a second layer thickness that is greater than the first layer thickness.

13. The production method as recited in claim 10, further comprising:
    developing the at least one supply line spring to be at least one of meander-shaped and spiral-shaped.

14. The production method as recited in claim 10, further comprising:
  developing the drive device to have a magnetic drive having a coil component situated on the control element as the at least one actuator component.

15. The production method as recited in claim 10, further comprising:
  situating the coil component at least partially one of on and in a coil plate;
  connecting the coil plate, using a spacer anchored thereto, to one of a mirror component and a filter component of the control element;
  connecting an end of the spacer facing away from the coil plate to an inner side of the one of the mirror component and the filter component facing away from an incident light surface of the one of the mirror component and the filter component; and
  anchoring the at least one vibratory spring by a first spring end thereof to the mounting support and by a second spring end thereof to the one of the mirror component and the filter component.

\* \* \* \* \*